(12) United States Patent
Brunker

(10) Patent No.: US 6,300,846 B1
(45) Date of Patent: Oct. 9, 2001

(54) FLAT FLEXIBLE CABLE WITH GROUND CONDUCTORS

(75) Inventor: David L. Brunker, Naperville, IL (US)

(73) Assignee: Molex Incorporated, Lisle, IL (US)

(*) Notice: Subject to any disclaimer, the term of this patent is extended or adjusted under 35 U.S.C. 154(b) by 0 days.

(21) Appl. No.: 09/271,538

(22) Filed: Mar. 18, 1999

(51) Int. Cl.[7] ........................................ H01P 3/02
(52) U.S. Cl. ........................ 333/1; 174/33; 174/261
(58) Field of Search ........................... 333/1, 12; 174/33, 174/261

(56) References Cited

U.S. PATENT DOCUMENTS

| | | | |
|---|---|---|---|
| 3,617,952 | 11/1971 | Breech | 333/116 |
| 3,761,842 | 9/1973 | Gandrud | 333/1 |
| 3,764,727 | 10/1973 | Balde | 174/34 |
| 5,036,160 | * 7/1991 | Jackson | 333/1 X |
| 5,296,651 | * 3/1994 | Gurrie et al. | 333/1 X |
| 5,397,862 | 3/1995 | Bockelman et al. | 174/250 |
| 5,675,298 | * 10/1997 | Bhagwan et al. | 333/1 |
| 5,939,952 | * 8/1999 | Noda et al. | 333/1 |
| 6,057,512 | * 5/2000 | Noda et al. | 333/12 X |
| 6,107,578 | * 8/2000 | Hashim | 333/1 X |

FOREIGN PATENT DOCUMENTS 5-120928   5/1993   (JP).
6-111642   4/1994   (JP).

* cited by examiner

*Primary Examiner*—Benny Lee
(74) *Attorney, Agent, or Firm*—Charles S. Cohen

(57) ABSTRACT

A flexible circuit member includes first and second pseudo-twisted flexible conductors on a flexible dielectric substrate. The first pseudo-twisted conductor is on a first side of the substrate and the second pseudo-twisted conductor is on a second side of the substrate. Each pseudo-twisted conductor includes a periodic pattern with the first pseudo-twisted conductor being shifted longitudinally relative to the second pseudo-twisted conductor by one half of a period of the periodic pattern. A set of first and second additional conductors are also provided on the dielectric substrate. The first additional conductor is on the first side of the substrate and is spaced from and generally follows the shape of the first pseudo-twisted conductor. The second additional conductor is on the second side of the substrate and is spaced from and generally follows the shape of the second pseudo-twisted conductor. These first and second additional conductors may be coupled to reference or ground potential so as to provide a grounding system for the flexible circuit member.

28 Claims, 4 Drawing Sheets

FLAT FLEXIBLE CABLE WITH GROUND CONDUCTORS

FIELD OF THE INVENTION

This invention generally relates to a flexible printed circuitry or cable ("FPC") and more particularly, to a new and improved FPC having ground conductors associated with at least a pair of pseudo-twisted conductors in the FPC.

BACKGROUND OF THE INVENTION

Electrical circuitry often should be protected from electromagnetic interference (EMI) and radio frequency interference (RFI) emanating from or impinging on the electrical circuitry. Although EMI and RFI often are referred to interchangeably, EMI has been used to connote energy occurring anywhere in the electromagnetic spectrum whereas RFI tends to connote interference in the radio communication band. EMI energy can be generated outside as well as inside the electrical circuitry. External EMI energy can interfere with the operation of the electrical circuitry or electronic equipment coupled thereto, while internal EMI energy can create "cross talk" and "noise" which can cause errors in the signals, such as data, transmitted through the electrical circuitry.

Electrical connectors are particularly prone to problems caused by EMI energy because of the density of contacts within the connectors and the openings in the connectors for electrical terminals and cables. While various electrical connectors have been designed with shielding that is effective against EMI/RFI energy, it often is desirable to shield the cables extending to the connectors as well as shielding the connectors themselves.

One type of cable used to reduce the effects from interference is referred to as a "twisted pair" cable. This type of cable includes two adjacent conductors or differential pairs twisted with respect to each other so that the lateral position of each conductor is reversed at each twist. In a given differential pair, electric currents flow in opposite directions in each of the conductors so that the benefits of the differential pair configuration are twofold.

First, the relative position of the conductors with respect to each other is constantly being reversed. As a result, any exterior magnetic or electric field in the vicinity of the twisted pair of conductors has a generally uniform effect upon that differential pair of conductors. In view of the fact that the current is flowing in opposite directions in the signal conductors of the differential pair and the impact of an induced or coupled noise component is generally uniform on both of those signal conductors and any harmful effects from exterior electromagnetic fields is reduced, if not eliminated, by stripping this common mode noise from the differential signal thereby lessening the chances that errors will be introduced into the data being transmitted on those signal conductors.

Second, an electromagnetic field is generated when current runs through a conductor. The orientation of that field is dependent upon the direction of the current flow in the conductor. With the constant changing of the juxtaposition of the conductors that form the differential signal pair, the field orientation for a given region is constantly being reversed and can be considered self-canceling. This canceling effect can substantially suppress the radiated emissions from a given differential pair.

FPC is another medium used for high speed data transmission between computers and the peripherals connected thereto. FPC is typically formed using a process in which a conductor such as copper is deposited uniformly over a flexible insulator substrate. A mask in a desired pattern is then applied to the conductor and the conductor is chemically removed everywhere except at the location of the mask. When the mask is removed, only the conductor remains in the desired pattern on the substrate. An insulator, such as tape or a flexible film, is applied over the conductor and to the flexible substrate in order that the conductor is sandwiched between two insulators.

While conductors on the same side of the insulator substrate of a FPC cannot be crossed, a "pseudo-twisted" arrangement can be achieved in a FPC by placing conductors of a given pair on opposite sides of the insulator substrate. The paths of these conductors are slightly and oppositely offset with respect to a common nominal path and this offset is periodically reversed at predetermined locations. An example of a "pseudo-twisted" FPC arrangement is shown in U.S. Pat. No. 3,761,842, dated Sep. 25, 1973. Another example of a "pseudo-twisted" FPC arrangement is shown in U.S. Pat. No. 5,939,952, dated Aug. 17, 1999 and assigned to the assignee of the present invention.

Pseudo-twisted FPC of the prior art typically has not included a grounding system when the cable is of a two layered construction having only two conductive layers, or when the cable has each of the pair of conductors on an opposite side of an insulative carrier or substrate. Such a prior art flexible printed circuit or FPC is illustrated in FIGS. 1 and 2 of the drawings and is generally designated by the reference numeral 1. The FPC 1 includes a flexible dielectric substrate 2 on opposite sides of which is disposed a plurality of pairs of pseudo-twisted conductors 3a and 3b. Conductor 3a is disposed on one side or surface of the flexible dielectric substrate 2 and the other conductor 3b is disposed on the opposite other side or surface of the substrate 2. An insulative film or coating can be disposed over the conductors 3a and 3b or can be disposed over the entire opposite surfaces of the flexible dielectric substrate 2 such that the conductors 3a and 3b will be covered by the film. In this way, each of the conductors 3a and 3b is sandwiched between the flexible substrate 2 and the protective film covering the surface on which the conductors 3a and 3b are disposed.

Each conductor 3a and 3b runs lengthwise of the FPC 1 in an oscillating pattern formed by alternate straight sections 4 and oblique sections 5. As a result, these conductors 3a and 3b extend in a periodic pattern symmetrically with respect to each other but on opposite sides or surfaces of the flexible substrate 2. The straight sections 4 of each conductor 3a and 3b are generally parallel to each other, but alternate along two parallel but spaced apart lines 4a and 4b (FIG. 1). The oblique sections 5 of each of the conductors 3a and 3b connects a pair of adjacent straight sections 4 and thus extends generally between straight-to-oblique transfer points or intersections 7 located at the lines 4a and 4b. In view of the fact that the conductors 3a and 3b are arranged symmetrically but opposite to each other, the straight sections 4 of the conductors 3a and 3b extend longitudinally generally parallel to each other but spaced apart laterally with respect to each other (left. to right as the sections 4 are viewed in FIG. 1). Consequently, the straight section 4 of the conductor 3a on one side of the substrate 2 is in alignment with the line 4a when the straight section 4 of the other conductor 3b on the opposite side of the substrate 2 is in alignment with the line 4b, and vice versa. As a result, the oblique sections 5 of the conductors 3a and 3b cross each other on opposite sides of the substrate 2 at crossover points 8.

Each of the conductors 3a and 3b separately terminates in one of a plurality of pads 9 (FIGS. 1–2) at edges 2a and 2b of the flexible substrate 2. The pads 9 of some of the conductors (for example, the conductor 3b) may include an associated through-hole or via 10. These pads 9 are arranged at equal intervals along the edges 2a and 2b of the FPC 1 for engagement with equally spaced contacts of an associated electrical connector. Therefore, either opposite edge of the FPC 1 having the pseudo-twisted conductors 3a and 3b can be inserted into such an electrical connector to establish a required electrical connection.

In the prior art FPC illustrated in FIGS. 1–2, the straight sections 4 of conductors 3a and 3b have uniform or equal widths along the lengths thereof. In an alternate embodiment, the length of the straight sections 4 could vary as is shown in U.S. Pat. No. 6,057,512, dated May 2, 2000 and assigned to the assignee of the present invention. Each oblique section 5 of each of the conductors 3a and 3b of the prior art FPC 1 disclosed in FIGS. 1–2 decreases in width uniformly in a direction from the straight-to-oblique transfer point or intersection 7 of one of the conductors 3a and 3b to the respective crossover point 8 of those conductors 3a and 3b where the oblique section 5 reaches its minimum width. Assuming that 1) the thickness of conductors 3a and 3b (i.e., in a direction perpendicular to the plane of the FPC 1) is uniform along the full length of the conductors 3a and 3b; 2) the distance in the same perpendicular direction between the conductors 3a and 3b remains constant; and 3) the dielectric constant of the material between the conductors 3a and 3b (i.e., the substrate 2) remains constant, the impedance of the conductors 3a and 3b increases due to the decrease in the width of each oblique section 5.

On the other hand, the impedance of those sections 5 also decreases because the conductor-to-conductor centerline distance between oblique sections 5 of conductors 3a and 3b in each pseudo-twisted pair decreases as the oblique sections 5 extend closer to each other at each crossover point 8. However, each oblique section 5 is uniformly reduced in width as it extends toward the cross over point 8 such that the impedance is caused to uniformly increase. In other words, the conductor-to-conductor centerline distance decreases between the oblique sections 5 of each pair of conductors 3a and 3b as they approach each other at each of the crossover points 8 such that the impedance of the conductors 3a and 3b is decreased. However, the width or lateral dimension of the oblique sections 5 also decreases as they approach the crossover points 8 such that the impedance of the conductors 3a and 3b uniformly increases. In essence, the impedance of the conductors 3a and 3b simultaneously decreases due to the reduction in the relative distance between the centerlines of the conductors 3a and 3b in the oblique sections 5 and increases due to the gradual tapering or narrowing of the conductors 3a and 3b in those oblique sections 5. This simultaneous decrease and increase in the impedances of the conductors 3a and 3b results in the impedance remaining substantially unchanged in the oblique sections 5 as they extend from the straight-to-oblique transfer points 7 to the crossover points 8. The impedance in the oblique sections 5 is preferably set to be equal to the impedance in the parallel extending sections 4 of the pseudo-twisted conductors 3a and 3b so that the pseudo-twisted FPC 1 has a relatively constant impedance along its entire length.

When a FPC is operating under ideal conditions, a return path or ground (sometimes referred to as a "virtual ground") is not necessarily needed. However, the signal in one conductor can lead the signal in the other conductor so that the signals are skewed or unbalanced. This tends to occur when the signals are being transmitted over an extended period of time, or over an extended distance or at a high speed data transmission rate. Problems associated with such skewed or unbalanced signals would be reduced if a ground reference is provided with respect to the conductors.

Heretofore, grounding grids have been used with FPC where a ground reference is needed. These grids constitute a ground plane of a conductive wire mesh formed by a plurality of ground conductors which crisscross each other to define open spaces therebetween. However, such grounding grids add an additional layer or layers to the two layered FPC. This increases the complexity of the FPC and thus makes it more expensive to manufacture. An example of a FPC with a ground grid arrangement is shown in co-pending application Ser. No. 08/932,545 filed Sept. 17, 1997 and assigned to the assignee of the present invention.

Consequently, it would be advantageous to provide a ground system in a FPC without the necessity of adding an additional layer to the FPC. Such a ground system would be particularly useful in a FPC that has conductors on opposite sides of an insulating substrate to form a pseudo-twisted flat FPC.

SUMMARY OF THE INVENTION

An object, therefore, of the present invention is to provide a new and improved grounding system in a flexible printed circuitry.

Another object of the present invention is to provide a new and improved FPC having at least a pair of pseudo-twisted conductors and ground conductors associated with each of those pairs of pseudo-twisted conductors.

Yet another object of the present invention is to provide a new and improved FPC with at least a pair of pseudo-twisted conductors disposed on opposite sides of an insulator substrate and a ground conductor disposed on each of those opposite sides of the substrate, each of such ground conductors being associated with one of the pseudo-twisted conductors.

In accordance with these and many other objects of the present invention, an embodiment of the present invention includes a FPC with a flexible dielectric substrate having first and second opposite sides. The circuitry that is disposed on the substrate includes first and second pseudo-twisted flexible conductors. The first pseudo-twisted conductor is disposed on the first side of the substrate and the second pseudo-twisted conductor is disposed on the second side of the substrate. Each pseudo-twisted conductor has a periodic pattern with the first pseudo-twisted conductor being shifted longitudinally relative to the second pseudo-twisted conductor by one half of a period of the periodic pattern. The first and second pseudo-twisted conductors extend along respectively on opposite first and second sides of the dielectric substrate such that crossover points are defined where the first and second pseudo-twisted conductors cross over each other although they are separated from each other by the flexible dielectric substrate. A set of first and second additional conductors also is provided on the dielectric substrate and can be coupled to ground potential. The first additional conductor is disposed on the first side of the substrate and is spaced laterally from but generally follows the path or shape of the first pseudo-twisted conductor. The second additional conductor is disposed on the second side of the substrate and is spaced laterally from but generally follows the path or shape of the second pseudo-twisted conductor. The first and second pseudo-twisted conductors and their corresponding first and second additional conductors can be considered a referenced set of pseudo-twisted conductors. Preferably, dielectric flexible films cover the outsides of the pseudo-twisted and the additional conductors disposed on the first and second sides of the dielectric.

Typically the FPC of the present invention includes a plurality of such referenced sets of pseudo-twisted conductors disposed on a flexible substrate. In one embodiment of the present invention, each of the referenced sets of pseudo-twisted conductors is separated a distance from any other adjacent referenced set of pseudo-twisted conductors so that none of the conductors in the referenced sets of pseudo-twisted conductors overlies each other. In another of the embodiments of the present invention, the distance between adjacent referenced sets of pseudo-twisted conductors is decreased such that an additional conductor in one of the referenced sets of pseudo-twisted conductors overlies on one side of the flexible substrate an additional conductor on the other side of the flexible substrate from another adjacent referenced set of pseudo-twisted conductors. In such a case, vias can be used to couple the overlying additional conductors.

Other objects, features and advantages of the present invention will be apparent from the following detailed description taken in connection with the accompanying drawings.

BRIEF DESCRIPTION OF THE DRAWINGS

The features of the present invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENTS

Figure 2:
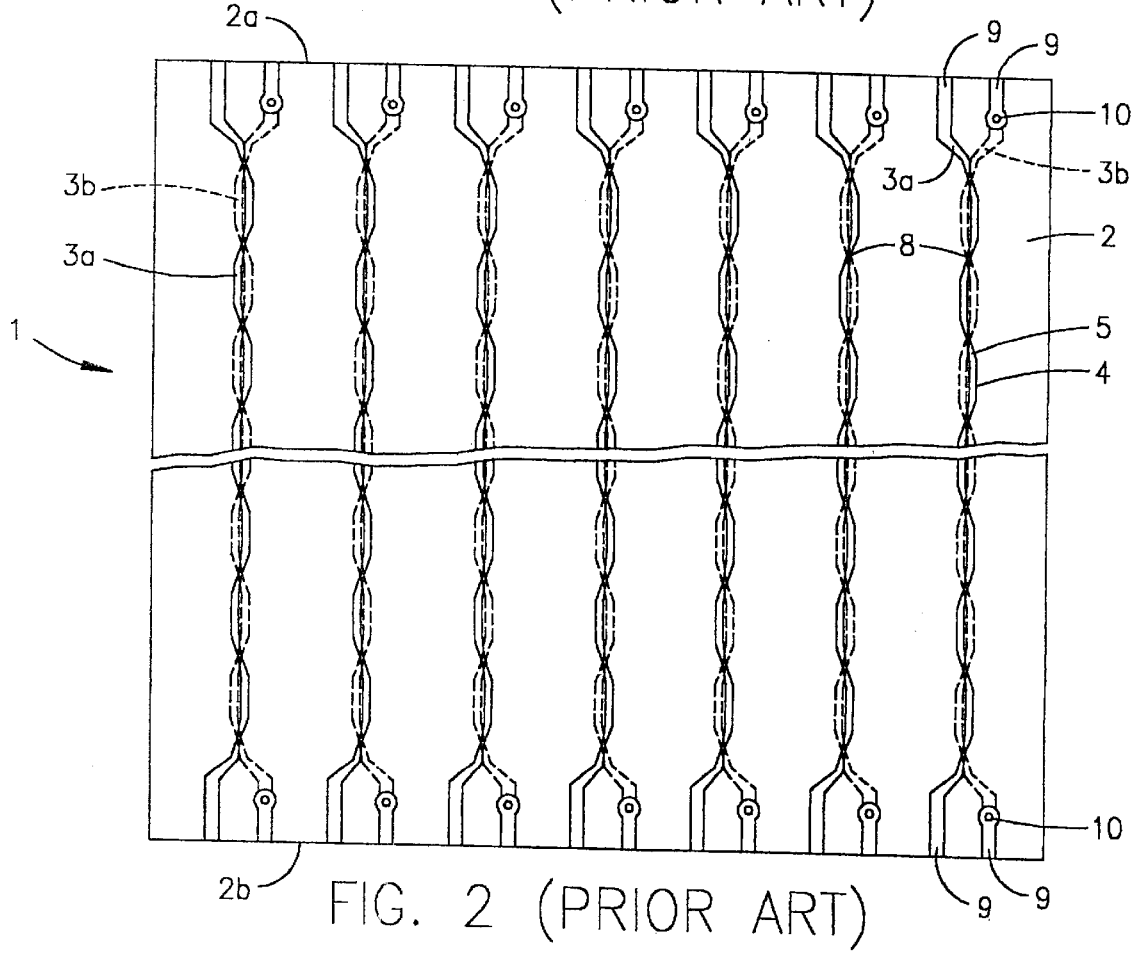
FIG. 2 is a fragmented plan view of a flexible printed circuitry of the prior art which incorporates a plurality of pairs of pseudo-twisted conductors and is discussed above in the Background of the Invention.
Figure 3:
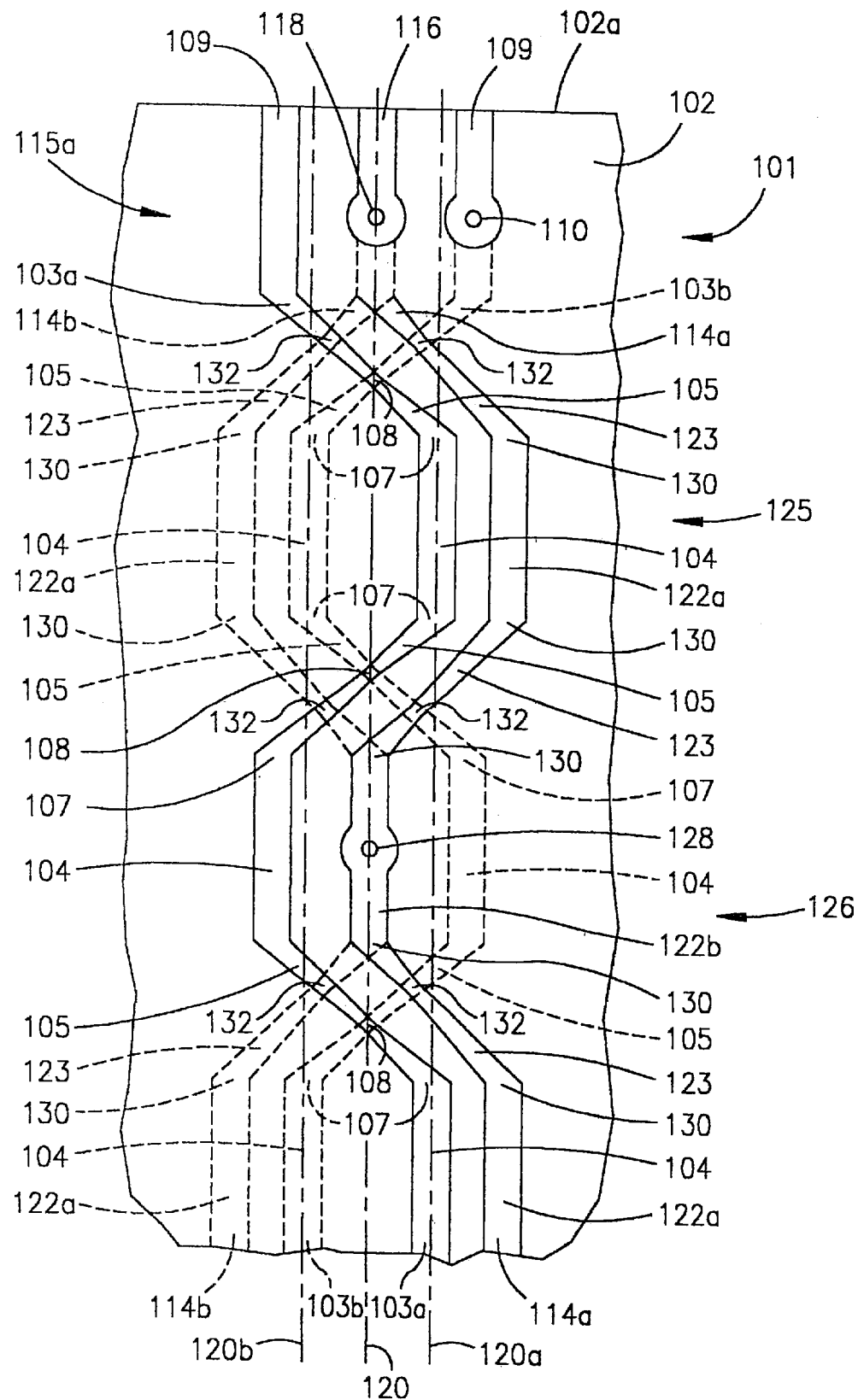
FIG. 3 is an enlarged, fragmented plan view of a portion of a flexible printed circuitry embodying the present invention which flexible printed circuitry includes at least one referenced set of pseudo-twisted conductors, each of which sets consists of a pair of pseudo-twisted conductors and additional conductors that can be used as a grounding system, the illustrated portion of the flexible printed circuitry is of two pseudo-twists or sections of the referenced set of pseudo-twisted conductors.
Figure 4:
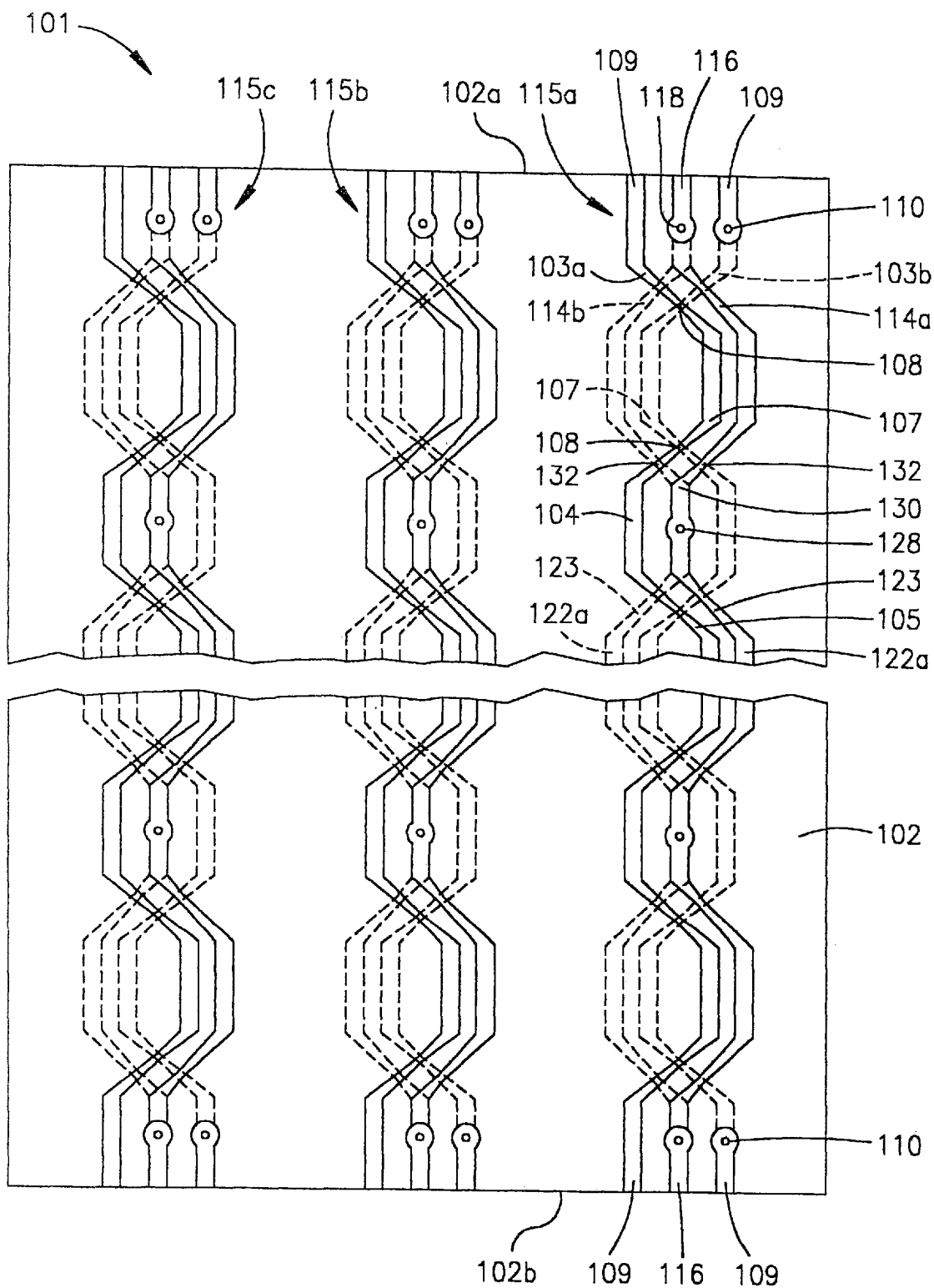
FIG. 4 is a fragmented plan view of a flexible printed circuitry embodying the present invention which incorporates a plurality of referenced sets of pseudo-twisted conductors.

Referring now more specifically to FIGS. 3–4 of the drawings, therein is shown a FPC which embodies the present invention and which is generally designated by the reference numeral 101. Like the prior art FPC 1 illustrated in FIGS. 1 and 2, the FPC 101 includes at least one pair of pseudo-twisted conductors 103a and 103b. Various different signals can be transmitted by those conductors 103a and 103b so that the conductors 103a and 103b will be referred to sometimes hereinafter as "signal" conductors. The signal conductors 103a and 103b extend lengthwise of the FPC 101 on opposite sides of a flexible substrate 102 in an oscillating or periodic pattern formed by alternate straight sections 104 and oblique sections 105 as is discussed above in describing the prior art pseudo-twisted conductors 3a and 3b in connection with FIGS. 1 and 2. Consequently, the components of the FPC 1 that are specifically referred to herein are referenced by the same reference numerals as the corresponding components in the FPC 1 except that the quantity 100 has been added to each of those reference numerals. In view of the similarity between the characteristics of the pseudo-twisted conductors 3a and 3b in relation to the FPC 1 of FIGS. 1 and 2 and the pseudo-twisted conductors 103a and 103b of the FPC 101, the characteristics of those conductors 103a and 103b will not be repeated in relation to the FPC 101 illustrated in FIGS. 3–4.

Figure 1:
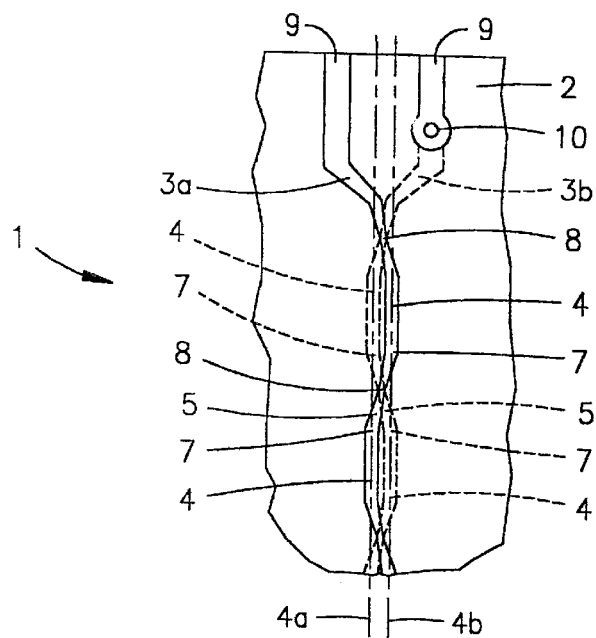
FIG. 1 is an enlarged, fragmented plan view of a portion of a length of a pair of pseudo-twisted conductors of the prior art, the illustrated portion of the conductors is of two pseudo-twists and is discussed above in the Background of the Invention.

Unlike the FPC 1 of FIGS. 1–2, the FPC 101 includes a pair of additional or following conductors 114a and 114b disposed on opposite sides of the flexible dielectric substrate 102. These additional conductors 114a and 114b may be coupled to ground potential and sometimes may be referred to herein as "ground" or "referenced" conductors. One of the additional conductors 114a is disposed on the same side or surface of the dielectric substrate 102 as the signal conductor 103a, and the other additional conductor 114b is disposed on the opposite side or surface of the substrate 102 along with the signal conductor 103b. The additional conductors 114a and 114b include terminal pads 116 on opposite sides of the flexible substrate 102 at edges 102a and 102b with the pads 116 being commoned or coupled together by a conductive through-hole or via 118.

In general, the additional conductors 114a and 114b "mirror" or follow the signal conductors 103a and 103b, respectively, in a direction longitudinally along a signal centerline 120 that extends longitudinally along the FPC 101 such that a referenced set 115a of pseudo-twisted conductors is formed by the signal conductors 103a and 103b and the additional conductors 114a and 114b (in the case of FIG. 4, three such referenced sets 115a, 115b and 115c of pseudo-twisted conductors are illustrated). In other words, signal conductor 103a has a generally periodic or oscillating pattern of straight sections 104 and oblique sections 105. The additional conductor 114a extends generally parallel to the signal conductor 103a on the same side or surface of the substrate 102 and includes straight sections 122a and 122b and oblique sections 123 extending along, but spaced slightly apart from the straight sections 104 and the oblique sections 105, respectively, of the signal conductor 103a. As a result, the pattern of the additional conductor 114a is generally parallel to the pattern of the signal conductor 103a. As described above in connection with the straight section 4 of the conductor 3a in the FPC 1, the length of straight sections 104 of the signal conductor 103a could vary and thus the length of the straight sections 122a and 122b of the additional conductor 114a could also vary as the length of the signal conductor 103a is changed.

The additional conductor 114b is disposed on the opposite side of the flexible dielectric substrate 102 from the side on which the additional conductor 114a is disposed (i.e., the additional conductor 114b is on the same side of the flexible dielectric substrate 102 on which the conductor 103*b* is disposed). Like the additional conductor 114*a*, the additional conductor 114*b* has straight sections 122*a* and 122*b* and oblique sections 123 which extend generally parallel to, but spaced apart from the straight sections 104 and the oblique sections 105, respectively, of the signal conductor 103*b*. As a result, the pattern of the additional conductor 114*b* is generally parallel to the pattern of the signal conductor 103*b*. As described above in connection with the straight section 104 of the conductor 103*a*, the length of straight sections 104 of the signal conductor 103*b* could vary and thus the length of the straight sections 122*a* and 122*b* of the additional conductor 114*b* could also vary as the length of the signal conductor 103*b* is changed.

As indicated from the above descriptions, the crossover points 108 of the signal conductors 103*a* and 103*b* define the longitudinal signal centerline 120 (see in particular FIG. 3). In essence, the signal conductors 103*a* and 103*b* have a generally "sine wave" shape centered about the centerline 120 at each crossover point 108. However, the additional conductors 114*a* and 114*b* actually never cross over the signal centerline 120 (the straight sections 122*b* do overlie the centerline 120). In this regard, the additional conductor 114*a* is always on the same side of or offset from the signal conductor 103*a* (the right-hand side as viewed in the FIG. 3 of the drawings) so that the additional conductor 114*a* closely follows the periodic pattern of the signal conductor 103*a*. In other words, the additional conductor 114*a* follows generally the same pattern as the signal conductor 103*a* but is centered about a centerline 120*a* which is laterally offset (to the right in FIG. 3) from the signal centerline 120. Similarly, the additional conductor 114*b* on the opposite side of substrate 102 is always on the same side of or offset from (the left-hand side as viewed in FIG. 3 of the drawing) the signal conductor 103*b* so that the additional conductor 114*b* closely follows the periodic pattern of the signal conductor 103*b*. In other words, the additional conductor 114*b* follows generally the same pattern as the signal conductor 103*b* but is centered about a centerline 120*b* which is laterally offset (to the left in FIG. 3) from the signal centerline 120. With this arrangement, the straight sections 122*a* and 122*b* of the additional conductors 114*a* and 114*b* alternate with each pseudo-twist of the signal conductors 103*a* and 103*b* from being located completely outside the pattern of the signal conductors 103*a* and 103*b* to being completely inside the signal conductors 103*a* and 103*b* relative to the longitudinal centerline 120 of the conductor pattern.

More specifically, reference numeral 125 in FIG. 3 designates a given twist section of the signal conductors 103*a* and 103*b* between a pair of crossover points 108 thereof, and reference numeral 126 designates the next adjacent twist section of the pseudo-twisted signal conductors 103*a* and 103*b*. In the twist section 125, the straight sections 122*a* of the additional conductors 114*a* and 114*b* are located "outside" (i.e., to the left or right in FIG. 3) the straight sections 104 of the signal conductors 103*a* and 103*b*. In the twist section 126, the straight sections 122*b* of the additional conductors 114*a* and 114*b* are "inside" the straight sections 114 of the signal conductors 103*a* and 103*b*. In this regard, the straight sections 122*b* of the additional conductors 114*a* and 114*b* in the twist section 126 are coincident with or in-line with the conductor centerline 120.

In connection with the FPC 101 illustrated in FIGS. 3–4, the distance along the centerline 120 between adjacent crossover points 108 is essentially the same. However, it has been found that the random location of crossover points 108 for conductors, such as the conductors 103*a* and 103*b*, reduces cross talk and noise between those conductors 103*a* and 103*b*. As a result, randomly differing lengths or distances between adjacent crossover points 108 can be utilized. For example, the distance or length between adjacent crossover points 108 can randomly vary in a range from 0.5 to 1.5 times a given medium length as determined by random statistics.

Another feature of the present invention is that conductive vias 128 may be provided that extend through the dielectric substrate 102 to interconnect the straight sections 122*b* of the additional conductors 114*a* and 114*b* in the twist sections 126 where the additional conductors 114*a* and 114*b* are coincident with the centerline 120. Such commoning or coupling of the additional conductors 114*a* and 114*b* ensures minimum ground voltage gradients in the FPC 101.

As is the case with the oblique sections 105 of the signal conductors 103*a* and 103*b*, the oblique sections 123 of the additional conductors 114*a* and 114*b* are disclosed as decreasing in width uniformly in a direction from straight-to-oblique transition points 130 of the respective additional conductors 114*a* and 114*b* to adjacent crossover points 132 where the additional conductors 114*a* and 114*b* cross over the signal conductors 103*a* and 103*b*. As is discussed above with respect to the oblique sections 5 in the FPC 1, this decrease in the width of the oblique sections 123 can be such that the impedance of the oblique sections 123 are similar to the impedance of the straight sections 122*a* and 122*b*. In the alternative, the oblique sections 123 connecting the straight sections 122*a* and 122*b* may be of uniform width.

While the width of the additional conductors 114*a* and 114*b* in the direction transverse to the longitudinal centerline 120 is generally the same as the width of the signal conductors 103*a* and 103*b*, the additional conductors 114*a* and 114*b* may be of a greater width at any section of the FPC 101 when compared to the corresponding section of the signal conductors 103*a* and 103*b*. In addition, the straight sections 122*b* of each of the additional conductors 114*a* and 114*b* could extend past the centerline 120 so as to be positioned closer to its respective straight section 104 of its corresponding signal conductor 103*a* and 103*b* rather than being positioned coincidental with the centerline 120.

As is more particularly illustrated in FIGS. 3–4, each of the conductors 103*a* and 103*b* separately terminates in one of a plurality of pads 109 at the edges 102*a* and 102*b* of the flexible substrate 102. The pads 109 of some of the conductors (for example, the conductor 103*b*) may include an associated through-hole or via 110. Likewise, the pads 116, in which the additional conductors 114*a* and 114*b* terminate, also are arranged along the edges 102*a* and 102*b* of the substrate 102. These pads 109 and 116 are arranged along the edges 102*a* and 102*b* of the FPC 101 so that they can be engaged by contacts of an associated electrical connector. Therefore, either opposite edge of the FPC 101 can be inserted into such an electrical connector to establish a required electrical connection.

Figure 5:
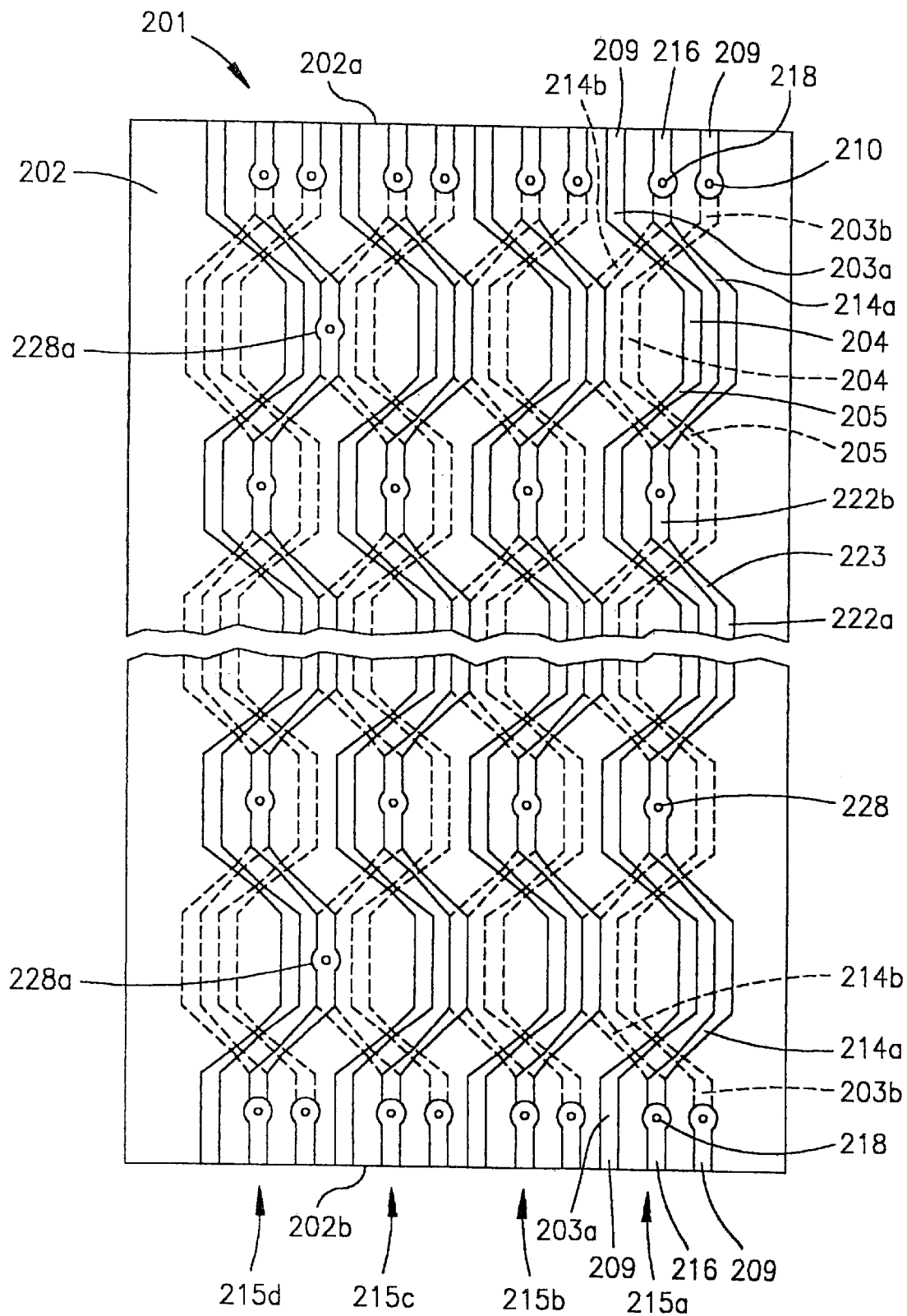
FIG. 5 is a fragmented plan view of an additional form of a flexible printed circuitry embodying the present invention which again incorporates a plurality of referenced sets of pseudo-twisted conductors with the spacing between the referenced sets of pseudo-twisted conductors being decreased as compared to the spacing between adjacent referenced sets of pseudo-twisted conductors in the embodiment illustrated in FIG. 4.

FIG. 5 shows an FPC which embodies the present invention and which is generally designated by the reference numeral 201. The FPC 201 includes a plurality of pseudo-twisted conductors 203*a* and 203*b*. As was the case with the conductors 103*a* and 103*b* in the FPC 101 of FIGS. 3 and 4, various different signals can be transmitted by those conductors 203*a* and 203*b* so that the conductors 203*a* and 203*b* will be referred to sometimes hereinafter as "signal" conductors. Each of the signal conductors 203*a* and 203*b* extends lengthwise of the FPC 201 on opposite sides of a flexible substrate 202 in an oscillating or periodic pattern formed by alternate straight sections 204 and oblique sections 205 in a similar fashion to the above described pseudo-twisted conductors 103a and 103b. Consequently, the components of the FPC 201 that are specifically referred to herein are referenced by the same reference numerals as the corresponding components in the FPC 101 except that the quantity 100 has been added to each of those reference numerals. In view of the similarity between the characteristics of the pseudo-twisted conductors 103a and 103b in relation to the FPC 101 of FIGS. 3 and 4 and the pseudo-twisted conductors 203a and 203b of the FPC 201, the characteristics of those conductors 203a and 203b will not be repeated in relation to the FPC 201 illustrated in FIG. 5.

Like the FPC 101, the FPC 201 includes a pair of additional or following conductors 214a and 214b disposed on opposite sides of the flexible dielectric substrate 202. These additional conductors 214a and 214b may be coupled to ground. potential and sometimes may be referred to herein as "ground" conductors. A pair of each such conductors 214a and 214b are respectively associated with each pair of the conductors 203a and 203b. In this regard, one of the additional conductors 214a is disposed on the same side or surface of the dielectric substrate 202 as the signal conductor 203a and the other additional conductor 114b is disposed on the opposite side or surface of the substrate 202 along with the signal conductor 203b. The additional conductors 214a and 214b include terminal pads 216 on opposite sides of the flexible substrate 202 at edges 202a and 202b with the possibility of pads 216 being commoned or coupled together by a conductive through-hole or via 218.

In general, the additional conductors 214a and 214b "mirror" or follow the signal conductors 203a and 203b, respectively, such that the additional conductor 214a extends generally parallel to the signal conductor 203a on the same side or surface of the substrate 202 and the additional conductor 214b extends generally parallel to the signal conductor 203b on the opposite side or surface of the substrate 202. In this regard, the additional conductors 214a and 214b each has straight sections 222a and 222b and oblique sections 223 which extend generally parallel to, but spaced apart from the straight sections 204 and the oblique sections 205, respectively, of the signal conductors 203a and 203b. As a result, the pattern of the additional conductors 214a and 214b is generally parallel to the pattern of the signal conductor 203a and 203b respectively. Moreover, each pair of signal conductors 203a and 203b and its corresponding pair of additional conductors 214a and 214b form a referenced set of pseudo-twisted conductors. In FIG. 4, four such referenced sets of pseudo-twisted conductors are illustrated and are designated respectively by the reference numerals 215a, 215b, 215c and 215d.

Somewhat unlike the FPC 101, the spacing between each of the referenced sets 215a, 215b, 215c and 215d of pseudo-twisted conductors in the FPC 201 is less than the spacing between adjacent referenced sets 115a, 115b and 115c of pseudo-twisted conductors in the FPC 101. As a result, the straight sections 222a of the additional conductors 214a in a given referenced set of pseudo-twisted conductors such as the referenced set 115a overlies on the opposite side of the substrate 202 the straight sections 222a of the other additional conductor 214b in the next adjacent referenced set of pseudo-twisted conductors such as the referenced set 115b. Nevertheless, an additional conductor 214a is closer to any adjacent conductors 203a in any given referenced set of pseudo-twisted conductors than any other conductor 203a in any other referenced set of pseudo-twisted conductors and an additional conductor 214b is closer to any adjacent conductors 203b in any given referenced set of pseudo-twisted conductors than any other conductor 203b in any other referenced set of pseudo-twisted conductors.

As was the case in connection with the FPC 101, another feature of the present invention is the possibility of providing conductive vias 228 that extend through the dielectric substrate 202 to interconnect the straight sections 222b of the additional conductors 214a and 214b in a given referenced set of pseudo-twisted conductors (for example, referenced set 215a) where they overlie each other on opposite sides of the substrate 202. Such commoning or coupling of the additional conductors 214a and 214b ensures minimum ground voltage gradients in the FPC 201. Another possibility is to provide vias between additional conductors 214b and 214a of adjacent referenced sets of pseudo-twisted conductors. For example as illustrated in FIG. 5, vias 228a are shown as coupling the additional conductor 214b in the referenced set 215c of pseudo-twisted conductors and the additional conductor 214a in the referenced set 215d of pseudo-twisted conductors. Again, this commoning or coupling of the additional conductors 214a and 214b in such adjacent referenced sets of pseudo-twisted conductors ensures minimum ground voltage gradients between the additional conductors of adjacent referenced sets of pseudo-twisted conductors in the FPC 201.

As is also illustrated in FIG. 5 in connection with the referenced set 215a of pseudo-twisted conductors, each of the conductors 203a and 203b separately terminates in one of a plurality of pads 209 at the edges 202a and 202b of the flexible substrate 202. The pads 209 of some of the conductors (for example, the conductor 203b) may include an associated through-hole or via 210. Likewise, the pads 216, in which the additional conductors 214a and 214b terminate, also are arranged along the edges 202a and 202b of the substrate 202. These pads 209 and 216 are arranged along the edges 202a and 202b of the FPC 201 so that they can be engaged by contacts of an associated electrical connector. Therefore, either opposite edge of the FPC 201 can be inserted into such an electrical connector to establish a required electrical connection.

Another variation of the present invention would be to utilize the circuitry of the FPC as an improved high density single ended FPC. Instead of utilizing signal conductors 103a and 103b (FIGS. 3 and 4) and signal conductors 203a and 203b (FIG. 5) as pseudo-twisted conductors for differential signals, each signal conductor could be utilized for transmitting individual signals as part of a single ended system. As such, each signal conductor is adjacent to and follows a reference conductor. The presence of the reference conductor will enable the possibility of establishing primary coupling of signal to reference conductor and thereby the possibility of single-ended operation.

It will be understood that the invention may be embodied in other specific forms without departing from the spirit or central characteristics thereof. For example, although the conductors are shown as having generally straight sections, the conductors could be "smoother" like a sine wave. The present examples and embodiments, therefore, are to be considered in all respects as illustrative and not restrictive, and the invention is not to be limited to the details given herein.

What is claimed is:
1. A flexible printed circuit member, comprising:
an elongated flexible dielectric substrate having first and second opposite sides with at least one axis therealong;
a first conductor disposed on said first side of said dielectric substrate, said first conductor comprising a plurality of first portions with at least one of said first portions of said first conductor having a pair of spatially offset first conductor sections and having a pair of first crossover sections, one of said first crossover sections interconnecting one of said first conductor sections to the other of said first conductor sections and the other of said first crossover sections being connected to said other of said first conductor sections;

a second conductor disposed on said second side of said dielectric substrate, said second conductor comprising a plurality of second portions with at least one of said second portions of said second conductor having a pair of spatially offset second conductor sections and having a pair of second crossover sections, one of said second crossover sections interconnecting one of said second conductor sections to the other of said second conductor sections and the other of said second crossover sections being connected to said other of said second conductor sections, each of said second crossover sections crossing on opposite sides of said substrate one of said first crossover sections at generally said axis;

a first additional conductor disposed on said first side of said dielectric substrate, said first additional conductor comprising a plurality of first additional portions with at least one of said first additional portions of said first additional conductor having a pair of spatially offset first additional conductor sections that are spatially offset from said first conductor sections and having a pair of first additional crossover sections spatially offset from said first crossover sections, one of said first additional crossover sections interconnecting one of said first additional conductor sections to the other of said first additional conductor sections and the other of said first additional crossover sections being connected to said other of said first additional conductor sections, each of said first additional crossover sections crossing on opposite sides of said substrate one of said second crossover sections at a position generally offset from said axis; and a second additional conductor disposed on said second side of said dielectric substrate, said second additional conductor comprising a plurality of second additional portions with at least one of said second additional portions of said second additional conductor having a pair of spatially offset second additional conductor sections that are spatially offset from said second conductor sections and having a pair of second additional crossover sections, one of said second additional crossover sections interconnecting one of said second additional conductor sections to the other of said second additional conductor sections and the other of said second additional crossover sections being connected to said other of said second additional conductor sections, each of said second additional crossover sections crossing on opposite sides of said substrate one of said first crossover sections at a position generally offset from said axis.

2. The flexible printed circuitry member of claim 1, including flexible dielectric films covering said first and second conductors and said first and second additional conductors.

3. The flexible printed circuitry member of claim 1, wherein each of said first conductor sections are substantially straight sections of said first conductor and are generally parallel to one of said first additional conductor sections and each of said second conductor sections are substantially straight sections of said second conductor and are generally parallel to one of said second additional conductor sections.

4. The flexible printed circuitry member of claim 1, wherein each of said first crossover sections are substantially oblique with respect to said axis and are generally parallel to one of said first additional crossover sections and each of said second crossover sections are substantially oblique with respect to said axis and are generally parallel to one of said second additional crossover sections.

5. The flexible printed circuitry member of claim 1, wherein at least one of said first additional conductor sections extends along said axis and at least one of said second additional conductor sections extends along said axis.

6. The flexible printed circuitry member of claim 5, wherein said one of said first additional conductor sections extending along said axis is electrically and mechanically interconnected to one of said second additional conductor sections extending along said axis through said dielectric substrate.

7. The flexible printed circuitry member of claim 6, including vias extending through said dielectric substrate for electrically and mechanically interconnecting said one of said first additional conductor sections extending along said axis to said one of said second additional conductor sections extending along said axis.

8. The flexible printed circuitry member of claim 1, wherein each of said first crossover sections decreases in width uniformly as said first crossover section extends from one of said first conductor sections towards one of said crossover points and each of said second crossover sections decreases in width uniformly as said second crossover section extends from one of said second conductor sections towards one of said crossover points.

9. The flexible printed circuitry member of claim 1, wherein each of said first additional crossover sections decreases in width uniformly as said first additional crossover section extends from one of said first additional conductor sections towards one of said additional crossover points and each of said second crossover sections decreases in width uniformly as said second crossover section extends from one of said second conductor sections towards one of said crossover points.

10. The flexible printed circuitry member of claim 1, wherein the distance along said axis between where one of said second crossover sections crosses on an opposite side of said substrate one of said first crossover sections and where the next adjacent said second crossover section crosses on an opposite side of said substrate another one of said first crossover sections is randomly determined.

11. The flexible printed circuitry member of claim 1, wherein said other of said first additional conductor sections extends along said axis and said one of said first additional conductor sections is offset from said axis, and wherein at least one of said first conductor sections being disposed between said axis and said one of said first additional conductor sections and wherein said other of said second additional conductor sections extends along said axis and said one of said second additional conductor sections is offset from said axis, and wherein at least one of said second conductor sections being disposed between said axis and said one of said second additional conductor sections.

12. The flexible printed circuitry member of claim 1, wherein said first and second additional conductors are coupled to ground potential.

13. The flexible printed circuitry member of claim 12, including vias extending through said flexible substrate to couple said first and second additional conductors to ground potential.

14. The flexible printed circuitry member of claim 1, including a plurality of sets of referenced conductors disposed adjacent each other on said substrate, each of which set of referenced conductors includes first and second conductors and corresponding first and second additional conductors.

15. The flexible printed circuitry member of claim 14, wherein a first additional conductor section of one of said sets of referenced conductors overlies on an opposite side of said substrate a second additional conductor section of an adjacent set of referenced conductors.

16. The flexible printed circuitry member of claim 15, wherein said first additional conductor section of said one of said sets of referenced conductors is electrically and mechanically interconnected to said second additional conductor section in said adjacent set of referenced conductors.

17. The flexible printed circuitry member of claim 16, including vias extending through said dielectric substrate for electrically and mechanically interconnecting said first additional conductor section to said second additional conductor section.

18. A flexible circuit member, comprising:
- a generally planar, flexible dielectric substrate having first and second opposite sides;
- a first pseudo-twisted signal conductor on said first side of said substrate and extending longitudinally on said first side of said substrate in a generally periodic pattern;
- a second pseudo-twisted signal conductor on said second side of said substrate and extending longitudinally on said second side of said substrate in a generally periodic pattern, said first and second pseudo-twisted conductors crossing over each other at crossover points separated by said dielectric substrate, the crossover points defining an axis with said first and second conductors reversing each other on opposite sides of said axis;
- a first additional conductor on said first opposite side of said substrate extending longitudinally on said first side of said substrate proximate said first conductor in a periodic pattern similar to that of said first conductor; and
- a second additional conductor on said second opposite side of said substrate extending longitudinally on said first side of said substrate proximate said second conductor in a periodic pattern similar to that of said second conductor.

19. The flexible printed circuitry member of claim 18, wherein said first additional conductor is always on the same side of said first conductor relative to said axis and said second additional conductor is always on the same side of said second conductor relative to said axis resulting in portions of said first conductor being disposed between said first additional conductor and said axis and portions of said second conductor being disposed between said second additional conductor and said axis.

20. The flexible printed circuitry member of claim 19, wherein portions of said first and second additional conductors are coincident with said axis.

21. The flexible printed circuitry member of claim 20, including vias extending through said substrate and coupling said first and second additional conductors at said portions that are coincident to said axis.

22. The flexible printed circuitry member of claim 21, wherein said first and second additional conductors are coupled to ground potential.

23. The flexible printed circuitry member of claim 18, including dielectric flexible films covering said first and second conductors and said first and second additional conductors.

24. A flexible printed circuit member, comprising:
- an elongated flexible dielectric substrate having first and second opposite sides;
- a set of first and second pseudo-twisted flexible conductors positioned on said dielectric substrate, said first pseudo-twisted conductor being on said first side of said substrate and said second pseudo-twisted conductor being on said second side of said substrate, each of said first and second pseudo-twisted conductors extending in a generally periodic pattern with the first pseudo-twisted conductor being shifted longitudinally relative to its respective second pseudo-twisted conductor by one half of a period of said periodic pattern, each pair of said first and second pseudo-twisted conductors defining crossover points at which said first and second pseudo-twisted conductors cross over each other on opposite sides of said flexible dielectric substrate; and
- a set of first and second following conductors positioned on the dielectric substrate, said first following conductor being on said first side of said substrate and being spaced from and generally following the pattern of said first pseudo-twisted conductor, and said second following conductor being on said second side of said substrate and being spaced from and generally following the pattern of said second pseudo-twisted conductor.

25. The flexible printed circuitry member of claim 24, wherein said first and second following conductors are coupled to ground potential.

26. The flexible printed circuitry member of claim 24, including dielectric flexible films covering said set of said first and second conductors and said set of said first and second following conductors.

27. The flexible printed circuitry member of claim 24, including a plurality of spaced apart sets of first and second pseudo-twisted conductors and a plurality of sets of first and second following conductors, each of said sets of first and second pseudo-twisted conductors being associated with one of said sets of first and second following conductors.

28. The flexible printed circuitry member of claim 27 wherein a portion of said first following conductor in one of said sets of first and second following conductors overlies on an opposite side of said substrate a second following conductor in an adjacent set of first and second following conductors.

* * * * *